US008021991B2

(12) United States Patent
Hughes et al.

(10) Patent No.: US 8,021,991 B2
(45) Date of Patent: Sep. 20, 2011

(54) TECHNIQUE TO RADIATION-HARDEN TRENCH REFILL OXIDES

(75) Inventors: Harold L Hughes, West River, MD (US); Bernard J Mrstik, Alexandria, VA (US); Reed K Lawrence, Purcellville, VA (US); Patrick J McMarr, Springfield, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 79 days.

(21) Appl. No.: 11/365,951

(22) Filed: Feb. 28, 2006

(65) Prior Publication Data

US 2006/0194454 A1   Aug. 31, 2006

Related U.S. Application Data

(60) Provisional application No. 60/656,386, filed on Feb. 28, 2005.

(51) Int. Cl.
*H01L 21/31* (2006.01)
*H01L 21/469* (2006.01)

(52) U.S. Cl. . 438/787; 438/783; 438/784; 257/E21.209; 257/E21.275; 257/E21.278; 257/E21.279; 257/E21.335; 257/E21.546; 257/E21.563

(58) Field of Classification Search .................. 438/503, 438/225, 28, 79; 257/79, E21.209, 275, 278, 257/279, 335, 546, 563
See application file for complete search history.

(56) References Cited

U.S. PATENT DOCUMENTS

| 4,555,300 | A  | * | 11/1985 | Arnold et al. ............. 117/43 |
| 4,688,078 | A  | * | 8/1987  | Hseih .................. 257/321 |
| 5,962,132 | A  | * | 10/1999 | Chang et al. ............ 428/402 |
| 6,297,095 | B1 | * | 10/2001 | Muralidhar et al. ....... 438/257 |
| 6,344,403 | B1 | * | 2/2002  | Madhukar et al. ........ 438/503 |
| 6,458,722 | B1 | * | 10/2002 | Kapoor et al. .......... 438/788 |
| 6,548,825 | B1 | * | 4/2003  | Yoshii et al. ........... 257/24 |
| 6,740,928 | B2 | * | 5/2004  | Yoshii et al. .......... 257/315 |
| 6,774,061 | B2 | * | 8/2004  | Coffa et al. ........... 438/197 |
| 7,259,055 | B2 | * | 8/2007  | Li et al. .............. 438/225 |
| 2002/0130418 | A1 | * | 9/2002 | Liu et al. ............. 257/760 |
| 2003/0132432 | A1 | * | 7/2003 | Yoshii et al. ........... 257/17 |
| 2003/0162363 | A1 | * | 8/2003 | Ji ..................... 438/424 |
| 2003/0194824 | A1 | * | 10/2003 | Hunt .................... 438/29 |

(Continued)

FOREIGN PATENT DOCUMENTS

KR    WO 03/065092 A1 *  8/2003

OTHER PUBLICATIONS

Hughes et al, "Radiation Effects and Hardening of MOS Technology: Devices and Circuits", IEEE Transactions on Nuclear Science, vol. 50, No. 3, Jun. 2003.

(Continued)

*Primary Examiner* — Haoi V Pham
*Assistant Examiner* — Eric Jones
(74) *Attorney, Agent, or Firm* — Amy Ressing; Roy Roberts

(57) ABSTRACT

Oxide films are deposited under conditions generating a silicon-rich oxide in which silicon nanoclusters form either during deposition or during subsequent annealing. Such deposition conditions include those producing films with optical indices (n) greater than 1.46. The method of the present invention reduces the TID radiation-induced shifts for the oxides.

10 Claims, 2 Drawing Sheets

U.S. PATENT DOCUMENTS

2005/0077526 A1* 4/2005 Shin et al. ............... 257/79
2006/0189014 A1* 8/2006 Li et al. .................. 438/28

OTHER PUBLICATIONS

Mrstik, et al, "The Role of Nanoclusters in Reducing Hole Trapping in Ion Implanted Oxides", IEEE Trans. Nucl. Sci, vol. 50k, pp. 1947-1953.

Shaneyfelt, et al "Challenges in Hardening Technologies Using Shallow-Trench Isolation," IEEE Trans. Nucl. Sci., vol. 45, pp. 2584, 1998.

Benedetto et al "Hole Removal in Thin-Gate MOSFETs by Tunneling," IEEE Trans. Nucl. Sci., vol. NS-32, pp. 3916, 1985.

Nouri et al, "An Optimized Shallow Trench Isolation for sub-0.18 micron ASIC Technologies," SPIE, vol. 3506, pp. 156, 1998.

Shimizu-Iwayama et al, "Correlation of Microstructure and Photoluminescence for Nanometer-Sized Si Crystals Formed in an Amorphous $SiO_2$ Matrix by Ion Implantation." NanoStructured Materials 5(3): 307-318, 1995.

Sabate, et. al., "Hole Traps and charges in ion implanted MOS capacitors: sensitivity to ionizing radiation", Microelectronics Reliability 40 (2000) 803-806.

Sune, et. al., Defect generation in silicon-implanted gate insulators of insulated gate field-effect transistors, J. Appl. Phys. 66, (12) Dec. 15, 1989, p. 5804.

* cited by examiner

TECHNIQUE TO RADIATION-HARDEN TRENCH REFILL OXIDES

CROSS-REFERENCE TO RELATED APPLICATIONS

This Application is a Non-Prov of Prov (35 USC 119(e)) application 60/656,386 filed on Feb. 28, 2005, incorporated herein in full by reference.

BACKGROUND OF THE INVENTION

The trench refill and buried oxides are limiting factors for the total ionizing dose (TID) hardness of oxide isolated integrated circuits (ICs). High-density-plasma (HDP) oxide deposition is typically used for trench refill in deep submicron ICs. HDP provides trench refill capabilities without the long thermal cycles required to prevent enhanced etching, as it occurs for Tetraethyl Orthosilicate (TEOS). However, characterization of the TID radiation-induced voltage shifts for commercial HDP oxides has shown them to be more radiation sensitive than TEOS refill oxides used for previous device generations.

TID hardness of ICs is degraded by charge buildup in refill oxides of trench regions and buried oxides. Hughes et al, "Radiation Effects and Hardening of MOS Technology: Devices and Circuits", IEEE Transactions on Nuclear Science, Vol. 50, No. 3, June 2003, provides an overview of radiation-induced effects and the many different approaches to their mitigation.

There is a need in the art for minimally invasive fabrication approaches for radiation hardening are needed to modify the charge trapping properties of deposited oxide films used in the semiconductor industry.

BRIEF SUMMARY OF THE INVENTION

Provided is a technique applicable to HDP, TEOS, and LTO oxide depositions needed to fabricate rad-hard deep submicron ICs. Oxide films are deposited under conditions generating embedded nanoclusters (one to ten nanometers in size) and/or nonstoichiometry. Such deposition conditions include those producing films with optical refractive indices (n) greater than 1.46 (at 632.8 nm). The method of the present invention provides a base line for HDP TID hardness and reduces the radiation-induced shifts in operating voltage for HDP oxides.

DETAILED DESCRIPTION OF THE INVENTION

Figure 1:
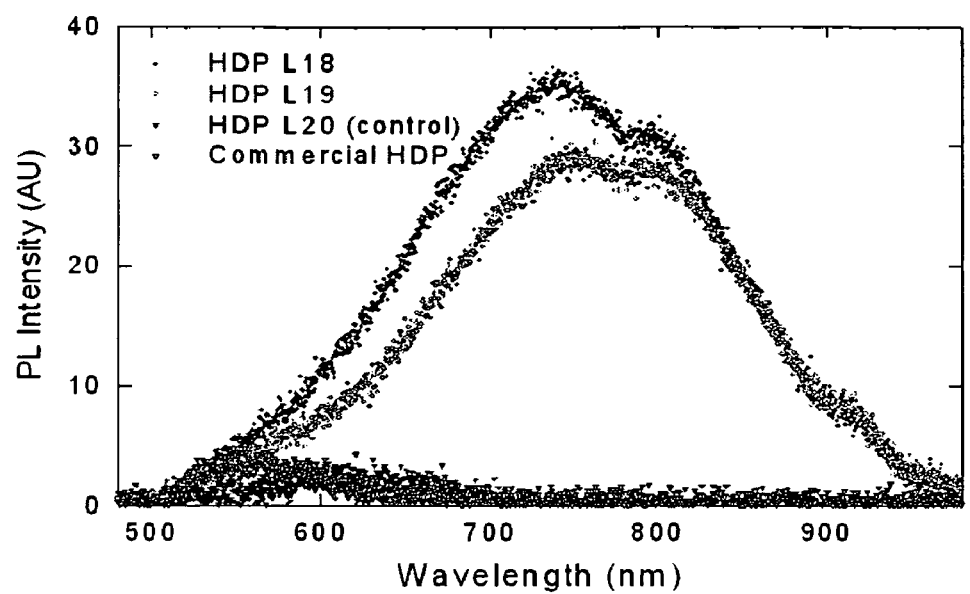
FIG. 1 shows PL spectra for a standard HDP oxide.

Oxide films are deposited under conditions generating embedded nanoclusters (one to ten nanometers in size) and/or nonstoichiometry. Such deposition conditions include those producing films with optical refractive indices (n) greater than 1.46 (at 632.8 nm). FIG. 1 shows photoluminescence (PL) spectra of silicon dioxide films having optical indices of refraction of n=1.46 (value for standard stoichiometric oxide), n=1.49, and n=1.52. The silicon dioxide films having optical indices of n=1.49 and n=1.52 were deposited using a high silane/oxygen ratio to form silicon-rich oxides (which have n greater than 1.46). The silicon-rich oxides are seen to have peaks in their PL spectra in the range of 600 to 900 nm, indicating the presence of silicon nanoclusters. In the samples with indices greater than n=1.46, much less change in flatband voltage occurs, therefore a greater than 10× improvement in radiation hardness is provided. The existence of embedded nanoclusters in these samples was established by PL techniques.

The deposition technique is a modification of the ion implantation techniques used to create embedded nanoclusters as described by Mrstik, et al, "The Role of Nanoclusters in Reducing Hole Trapping in Ion Implanted Oxides", IEEE Trans. Nucl. Sci, vol. 50k, pp. 1947-1953, incorporated in full herein by reference. Mrstik, et al describes a method of implanting Si or Ar ions approximately 60 nm below the oxide surface by using an implant energy of 43 or 58 keV, respectively, and a 7° angle of incidence.

Mrstik provides for the preparation of 209-nm-thick thermal oxides grown on 5-10-ohm-cm p-type Si (100) substrates in dry $O_2$ at 925° C. The oxide thickness was chosen to approximate that of the field oxide, buried oxide, or shallow trench refill oxide responsible for total dose radiation-induced damage in contemporary submicron devices. Si or Ar ions were placed about 60 nm below the oxide surface by using an implant energy of 43 or 58 keV, respectively, and a 7° angle of incidence. An implant dose of $1\times10^{13}$, $1\times10^{14}$, $1\times10^{15}$ or $1\times10^{16}$ cm$^{-2}$ was used, followed by an anneal in Ar for 30 min at 700, 900, or 1050° C. Unimplanted control oxides were annealed along with the implanted oxides. For PL measurements, an additional implant/anneal run was made using an implant dose of $3\times10^{16}$ Si$^+$/cm$^2$, then annealed at 900 or 1050° C. in Ar for 30 minutes. Some samples were further annealed in forming gas (10% $H_2$ in $N_2$) at 400° C. for 30 min.

The present technique uses an Applied Materials DKP deposition tool to deposit oxide films with high refractive indices such as to include nanoclusters. The present approach does not require ion implantation as used in Mrstik, et al, but a modification in oxide deposition conditions, in which the silane/oxygen ratio is increased to a range of 1.01 to 1.11 in order to deposit a silicon-rich oxide of the desired optical refractive index. Standard deposition conditions are used; excepting the increased silane/oxygen ratio range of 1.01 to 1.11. This is accomplished simply by controlling the mass flow for the two gases. Silicon nanoclusters form in these silicon-rich oxides during deposition and/or during subsequent heat treatment at temperatures between 900° C. and 1100° C. The silicon nanoclusters range from about one to about ten nanometers in size.

EXAMPLES

Samples were prepared by using HDP techniques to deposit oxides having indices of 1.49 (sample L19), 1.52 (sample L18), and 1.46 (sample L20) on silicon substrates. The presence of nanoclusters was determined using photoluminescence (PL), with an argon laser as the excitation source. FIG. 1 indicates a large PL signal for samples L18 and L19, indicating the presence of nanoclusters in these samples, whereas the control and the commercial HDP oxide film show no PL peak between 600 and 800 900 nm, indicating they do not have nanoclusters. The small peak at 550 nm is an artifact due to the filter used in the experimental setup.

MOS capacitors were fabricated from each of the samples and were electrically characterized using capacitance-voltage (CV) techniques. They were then irradiated using and ARACOR 4100 X-ray system, then electrically characterized again to determine the shift in the flatband voltage. The irradiations were performed at a dose-rate of 1800 rd/s with an applied field of $5\times10^4$ V/cm.

Figure 2:
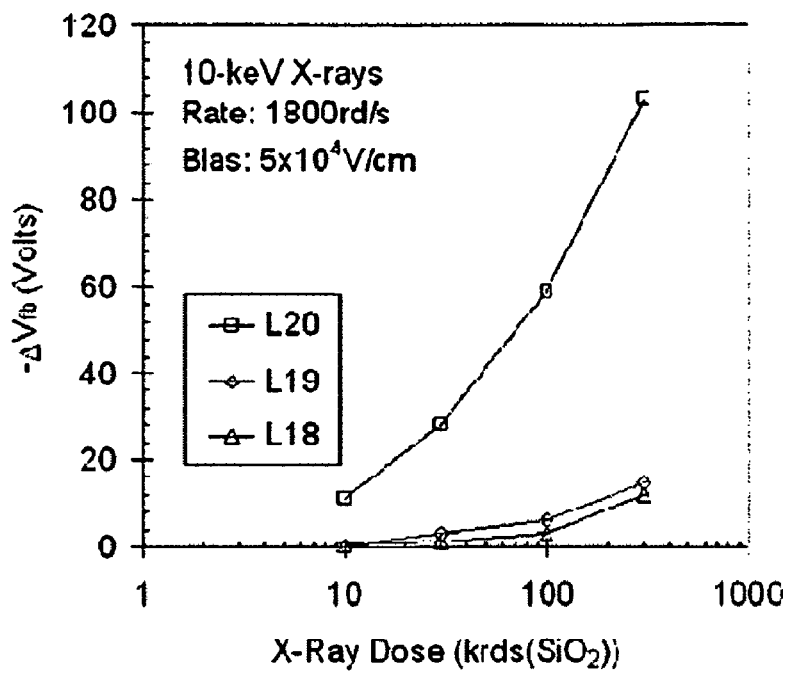
FIG. 2 shows the shifts in the flatband voltage of an MOS capacitor versus TID.

FIG. 2 shows the shift in the flatband voltage (determined from capacitance-voltage (CV) measurements) on the MOS capacitors versus TID for samples L18, L19, and L20, and shows that much less charge is trapped in the samples having the higher refractive indices (having nanoclusters). For example, at 300 krd ($SiO_2$) it can be clearly seen that the samples with nanoclusters are nearly 10× more radiation hard than the control without nanoclusters. Minimally invasive modifications can be made in the fabrication process of high-density plasma (HDP) oxides for radiation hardening of the IC trenches.

Figure 3:
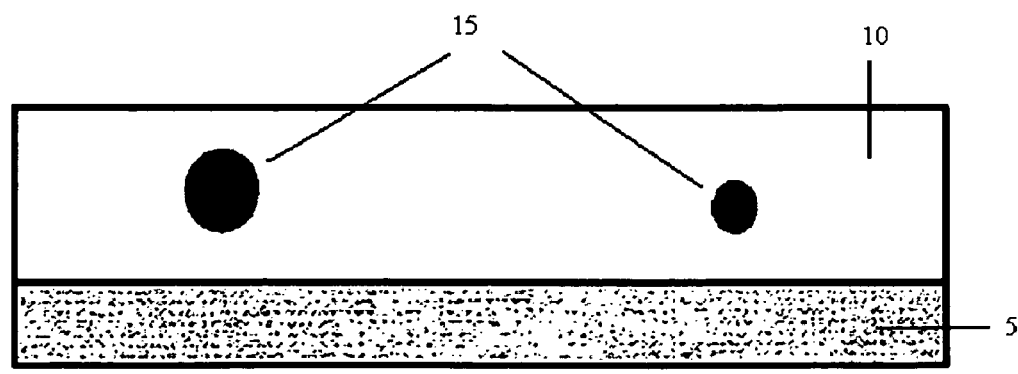
FIG. 3 shows the a radiation hardened oxide.

FIG. 3 shows a radiation hardened oxide comprised of a substrate 5 and an oxide layer 10, said oxide layer 10 having nanoclusters 15.

Obviously, many modifications and variations of the present invention are possible in light of the above teachings. It is therefore to be understood that, within the scope of the appended claims, the invention may be practiced otherwise than as specifically described.

What is claimed as new and desired to be protected by Letters Patent of the United States is:

1. A method of radiation hardening an oxide, comprising:
   providing a substrate;
   depositing a silicon rich oxide film on said substrate, said silicon rich oxide film having a refractive index of at least 1.52, wherein said depositing embeds nanoclusters in said silicon rich oxide film; and
   heat treating said silicon rich oxide film.

2. The method of claim 1 wherein said nanoclusters are comprised of silicon.

3. The method of claim 1 wherein said heat treating step occurs at a temperature ranging from about 900° C. to about 1100° C.

4. The method of claim 1 wherein said nanoclusters range in size from about one nanometer to about ten nanometers.

5. The method of claim 1, wherein the radiation hardened oxide exhibits a voltage shift of less than 30 volts when exposed to 1000 krds of 10-keV X-rays at a rate of 1800 rd/s under a bias of $5\times10^4$ V/cm.

6. A method of radiation hardening an oxide, comprising:
   providing a substrate;
   depositing a silicon rich oxide film under conditions in which the silane/oxygen ratio ranges from 1.01 to 1.11 wherein said silane/oxygen deposition conditions embed nanoclusters in said silicon rich oxide film, said silicon rich oxide film having a refractive index greater than 1.52; and
   heat treating said oxide.

7. The method of claim 6 wherein said nanoclusters are comprised of silicon.

8. The method of claim 6 wherein said heat treating step occurs at a temperature ranging from about 900° C. to about 1100° C.

9. The method of claim 6 wherein said nanoclusters range in size from about one nanometer to about ten nanometers.

10. The method of claim 6, wherein the radiation hardened oxide exhibits a voltage shift of less than 30 volts when exposed to 1000 krds of 10-keV X-rays at a rate of 1800 rd/s under a bias of $5\times10^4$ V/cm.

* * * * *